(12) United States Patent
Gao et al.

(10) Patent No.: US 11,349,036 B2
(45) Date of Patent: May 31, 2022

(54) SAW-TOOTHED ELECTRODE AND METHOD FOR ENHANCING PERFORMANCE OF NANOWIRE UV DETECTOR

(71) Applicant: Beijing University of Technology, Beijing (CN)

(72) Inventors: Zhiyuan Gao, Beijing (CN); Liwei Lu, Beijing (CN); Lihuan Zhao, Beijing (CN); Deshu Zou, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 16/820,997

(22) Filed: Mar. 17, 2020

(65) Prior Publication Data

US 2021/0167226 A1 Jun. 3, 2021

(30) Foreign Application Priority Data

Dec. 2, 2019 (CN) .......................... 201911212069.X

(51) Int. Cl.
| | | |
|---|---|---|
| *H01L 31/0224* | (2006.01) | |
| *H01L 27/146* | (2006.01) | |
| *H01L 31/09* | (2006.01) | |

(52) U.S. Cl.
CPC .... *H01L 31/0224* (2013.01); *H01L 27/14601* (2013.01); *H01L 31/09* (2013.01)

(58) Field of Classification Search
None
See application file for complete search history.

(56) References Cited

U.S. PATENT DOCUMENTS

| | | | | |
|---|---|---|---|---|
| 6,208,499 | B1* | 3/2001 | Yonekawa | .............. H01T 19/04 |
| | | | | 361/213 |
| 2009/0001280 | A1* | 1/2009 | Adachi | .............. G03G 15/0291 |
| | | | | 250/423 R |
| 2012/0073641 | A1* | 3/2012 | Tseng | .................. H01L 31/1884 |
| | | | | 136/256 |
| 2014/0050969 | A1* | 2/2014 | Rust, III | ............... H01M 4/133 |
| | | | | 429/160 |

* cited by examiner

*Primary Examiner* — Steven M Christopher
(74) *Attorney, Agent, or Firm* — Bryan L. Baysinger; Nexsen Pruet, LLC

(57) ABSTRACT

The present invention discloses a saw-toothed electrode and a method for enhancing the performance of a nanowire UV detector, and relates to the field of semiconductor technologies. The saw-toothed electrode includes two symmetrically arranged patterns; the pattern includes a rectangle and multiple isosceles trapeziums; lower bases of the isosceles trapeziums are connected to a same long side of the rectangle; opposite sides of the two patterns are sides on which multiple isosceles trapeziums are located; equal-length legs and the upper base of the isosceles trapezium are used to grow nanowires; and nanowires grown on upper bases of two isosceles trapeziums, symmetric to each other, on the opposite sides of the two patterns form bridges.

4 Claims, 5 Drawing Sheets

SAW-TOOTHED ELECTRODE AND METHOD FOR ENHANCING PERFORMANCE OF NANOWIRE UV DETECTOR

CROSS REFERENCE TO RELATED APPLICATIONS

This application claims priority under 35 U.S.C. § 119 to Chinese Patent Application No. 201911212069.X filed Dec. 2, 2019, the entirety of which is incorporated by reference herein.

TECHNICAL FIELD

The present invention relates to the field of nano technology, and in particular, to a saw-toothed electrode and a method for enhancing the performance of a nanowire UV detector.

BACKGROUND

A UV detector is one of indispensable devices applied in environmental monitoring, UV communication, life science, missile guidance, early warning, and other fields. Nanostructured materials can greatly enhance the performance of devices. At present, most of the research on UV detectors focuses on their materials and performance Using a third-generation wide-bandgap semiconductor material ZnO as an example, there have been researches on the fabrication of a single ZnO nanowire UV detector by depositing electronic contacts using an electron-beam lithography technology. Compared with an undoped zinc oxide thin film based metal semiconductor metal (MSM) UV detector fabricated by Wang Yi. al, the gain of the single ZnO nanowire UV detector is increased by $10^3$, and a response speed thereof is increased by more than 4 times. This indicates that ZnO nanowires have great potential in UV detection. Usually, there are two approaches in nanotechnology for fabricating precision nanodevices with special sizes and patterns, a top-down approach and a bottom-up approach. The top-down approach is used to prepare a nanostructure by the electron beam lithography and other methods. However, this method has extremely low electron-beam efficiency and is not applicable to large-scale industrial production. The bottom-up approach is used to prepare a nanostructure on an existing electrode with a micrometer or even millimeter structure; and the preparation method may include in-situ control, nanoimprint lithography, and direct self-organized growth of the nanostructure. However, the in-situ control method requires highly precise instruments in the preparation and test processes and has high costs. Therefore, this method can only be used for functional verification in laboratories, and cannot be used for industrial production. The nanoimprint lithography method may damage some surface characteristics of a nanostructure that determine the excellent performance of the nanostructure. Currently, a horizontal nanowire-based detector is a type of UV detector with relatively good performance, in which a metal electrode is an important part. A simple electrode shape is commonly used currently. Specifically, a seed layer in a shape including rectangles or squares symmetric to each other is fabricated; a metal electrode is covered on the seed layer; and nanowires are horizontally grown at the edge of a symmetry plane as an effective photosensitive area. The method is simple and easy, but a nanowire detector fabricated by this method usually has relatively low performance Especially, a response time of the nanowire detector requires tens of seconds. Another commonly used electrode shape is an interdigital structure in which nanowires are horizontally grown between electrode fingers. Nanowires grown by the method is highly dense and some nanowires are grown obliquely upwards. In this case, ultrasonic treatment is required subsequently to remove excessive nanowires, to avoid shielding of an effective photosensitive area of a detector. As a result, more processing steps are required and it is difficult to control the ultrasonic frequency. Therefore, there exist problems of low performance and process incompatibility in an existing metal electrode.

SUMMARY

An objective of the present invention is to provide a saw-toothed electrode and a method for enhancing the performance of a nanowire UV detector, to resolve the problems of low performance and process incompatibility in a metal electrode.

To achieve the above purpose, the present invention provides the following technical solutions.

A saw-toothed electrode is provided, where the saw-toothed electrode includes two symmetrically arranged patterns;

the pattern includes a rectangle and multiple isosceles trapeziums; a length of an upper base of each isosceles trapezium is less than that of a lower base thereof; the lower bases of all the isosceles trapeziums are connected to a same long side of the rectangle; and a distance between center lines of two adjacent isosceles trapeziums is equal to a height of the isosceles trapezium; and opposite sides of the two patterns are sides on which multiple isosceles trapeziums are located; equal-length legs and the upper base of the isosceles trapezium are used to grow nanowires; and nanowires grown on upper bases of two isosceles trapeziums, symmetric to each other, on the opposite sides of the two patterns to form bridges.

Optionally, the saw-toothed electrode includes an electrode substrate, a seed layer, and a combination electrode layer;

the seed layer is arranged on the electrode substrate;

the combination electrode layer includes a titanium electrode layer and a gold electrode layer; and the titanium electrode layer is arranged on the seed layer, and the gold electrode layer is arranged on the titanium electrode layer.

Optionally, the length of the upper base of the isosceles trapezium is 2-10 μm, the length of the lower base of the isosceles trapezium is 5-25 μm, and the height of the isosceles trapezium is 5-25 μm; and the distance between center lines of two adjacent isosceles trapeziums is 5-25 μm.

Optionally, a thickness of the seed layer is 50-400 nm; a thickness of the titanium electrode layer is 15-40 nm; and a thickness of the gold electrode layer is 50-400 nm.

A method for enhancing the performance of a nanowire UV detector is further provided, including:

fabricating a saw-toothed electrode, where the saw-toothed electrode includes two symmetrically arranged patterns; the pattern includes a rectangle and multiple isosceles trapeziums; a length of an upper base of each isosceles trapezium is less than that of a lower base thereof; the lower bases of all the isosceles trapeziums are connected to a same long side of the rectangle; and a distance between center lines of two adjacent isosceles trapeziums is equal to a height of the isosceles trapezium; opposite sides of the two patterns are sides on which the multiple isosceles trapeziums are located; equal-length legs and the upper base of the isosceles trapezium are used to grow nanowires; and nanowires grown on upper bases of two isosceles trapeziums, symmetric to each other, on the opposite sides of the two patterns to form bridges; the saw-toothed electrode includes an electrode substrate, a seed layer, and a combination electrode layer; the seed layer is arranged on the electrode substrate; the combination electrode layer includes a titanium electrode layer and a gold electrode layer; and the titanium electrode layer is arranged on the seed layer, and the gold electrode layer is arranged on the titanium electrode layer;

growing nanowires on the seed layer of the saw-toothed electrode by using a hydrothermal method, where nanowires are grown on equal-length legs and an upper base of an isosceles trapezium of the seed layer; and nanowires grown on upper bases of two isosceles trapeziums, symmetric to each other, on the opposite sides of the two patterns to form bridges; and spin-coating the surface modification solution onto the saw-toothed electrode on which the nanowires are grown, and drying the saw-toothed electrode, to obtain the nanowire UV detector.

Optionally, the fabricating a saw-toothed electrode specifically includes:

fabricating a photomask according to a layout, where a shape of the layout is the shape of the saw-toothed electrode;

cleaning the electrode substrate;

covering the photomask on the cleaned electrode substrate, and conducting photoetching on the electrode substrate to obtain the layout;

sputtering the seed layer on the layout;

sputtering the titanium electrode layer on the seed layer;

sputtering the gold electrode layer on the titanium electrode layer to obtain an initial device; and removing photoresist on the initial device by using a stripping technology to obtain the saw-toothed electrode.

Optionally, the cleaning the electrode substrate specifically includes:

cleaning the electrode substrate twice with acetone;

cleaning the electrode substrate twice with ethanol; and cleaning the electrode substrate twice with deionized water.

Optionally, the removing photoresist on the initial device by using a stripping technology to obtain the saw-toothed electrode specifically includes:

soaking the initial device in acetone; and stripping the photoresist on the soaked initial device by ultrasonic treatment.

Optionally, the growing nanowires on the seed layer of the saw-toothed electrode by using a hydrothermal method specifically includes:

dissolving zinc nitrate hexahydrate and hexamethylenetetramine in deionized water according to a preset proportion, stirring an obtained solution for a preset time by using a magnetic stirring bar to obtain a nanowire culture solution, and pouring the nanowire culture solution into a container; and placing the surface of the saw-toothed electrode with the seed layer, the titanium electrode layer, and the gold electrode layer in the nanowire culture solution, and placing the container containing the saw-toothed electrode and the nanowire culture solution in an incubator for growing nanowires.

Optionally, spin-coating the surface modification solution onto the saw-toothed electrode on which the nanowires are grown, and drying the saw-toothed electrode, to obtain the nanowire UV detector specifically includes:

taking out the saw-toothed electrode on which the nanowires are grown from the nanowire culture solution, and drying the saw-toothed electrode;

spin-coating the modification solution onto the surface of the dried saw-toothed electrode at a preset speed; and placing the spin-coated saw-toothed electrode in an incubator for baking, to obtain the nanowire UV detector.

According to specific embodiments provided in the present invention, the present invention discloses the following technical effects:

The present invention provides a saw-toothed electrode and a method for enhancing the performance of a nanowire UV detector. The saw-toothed electrode includes two symmetrically arranged patterns; the pattern includes a rectangle and multiple isosceles trapeziums; a length of an upper base of each isosceles trapezium is less than that of a lower base thereof; the lower bases of all the isosceles trapeziums are connected to a same long side of the rectangle; a distance between center lines of two adjacent isosceles trapeziums is equal to a height of the isosceles trapezium; opposite sides of the two patterns are sides on which multiple isosceles trapeziums are located; equal-length legs and the upper base of the isosceles trapezium are used to grow nanowires; nanowires grown on upper bases of two isosceles trapeziums, symmetric to each other, on the opposite sides of the two patterns form bridges; the saw-toothed electrode includes an electrode substrate, a seed layer, and a combination electrode layer; the seed layer is arranged on the electrode substrate; the combination electrode layer includes a titanium electrode layer and a gold electrode layer; and the titanium electrode layer is arranged on the seed layer, and the gold electrode layer is arranged on the titanium electrode layer. In the shape of the saw-toothed electrode in the present invention, there are multiple same isosceles trapezoids on the opposite sides of the two patterns. Nanowires are directly grown on the side wall of the seed layer of the saw-toothed electrode and only nanowires grown on the upper bases of the isosceles trapeziums form effective bridges. Compared with an electrode on which nanowires are vertically grown, the saw-toothed electrode can obtain a larger illumination area, improve optical efficiency, and increase a response speed and an optical gain. Compared with an ordinary electrode on which a nanowire array is horizontally grown, the saw-toothed electrode can reduce the number of nanowire bridges and increase a response speed and an optical gain of a nanowire array UV detector. In addition, after the nanowires are grown, there is no need to remove excessive nanowires through ultrasonic treatment, which reduces processing steps and costs and is easy to implement mass production.

The method for enhancing the performance of a nanowire UV detector in the present invention includes: fabricating a saw-toothed electrode, where the saw-toothed electrode includes two symmetrically arranged patterns; the pattern includes a rectangle and multiple isosceles trapeziums; a length of an upper base of each isosceles trapezium is less than that of a lower base thereof; the lower bases of all the isosceles trapeziums are connected to a same long side of the rectangle; and a distance between center lines of two adjacent isosceles trapeziums is equal to a height of the isosceles trapezium; opposite sides of the two patterns are sides on which the multiple isosceles trapeziums are located; equal-length legs and the upper base of the isosceles trapezium are used to grow nanowires; and nanowires grown on upper bases of two isosceles trapeziums, symmetric to each other, on the opposite sides of the two patterns to form bridges; the saw-toothed electrode includes an electrode substrate, a seed layer, and a combination electrode layer; the seed layer is arranged on the electrode substrate; the combination electrode layer includes a titanium electrode layer and a gold electrode layer; and the titanium electrode layer is arranged on the seed layer, and the gold electrode layer is arranged on the titanium electrode layer; growing nanowires on the seed layer of the saw-toothed electrode by using a hydrothermal method, where nanowires are grown on equal-length legs and an upper base of an isosceles trapezium of the seed layer; and nanowires grown on upper bases of two isosceles trapeziums, symmetric to each other, on the opposite sides of the two patterns form bridges; and spin-coating the surface modification solution onto the saw-toothed electrode on which the nanowires are grown, and drying the saw-toothed electrode, to obtain the nanowire UV detector. According to the method for enhancing the performance of a nanowire UV detector in the present invention, nanowires are directly grown on a side wall of the seed layer of the saw-toothed electrode and only nanowires grown on the upper bases of the isosceles trapeziums form effective bridges. This can reduce the number of nanowire bridges and increase a response speed and an optical gain of a nanowire UV detector. Compared with an ordinary electrode on which a nanowire array is horizontally grown, after the nanowires are grown, there is no need to remove excessive nanowires through ultrasonic treatment. Therefore, processing steps and costs are reduced and it is easy to implement mass production.

BRIEF DESCRIPTION OF DRAWINGS

To describe the technical solutions in the embodiments of the present invention or in the prior art more clearly, the following briefly describes the accompanying drawings required in the embodiments. Apparently, the accompanying drawings in the following description show some embodiments of the present invention, and a person of ordinary skill in the art may still derive other drawings from these accompanying drawings without creative efforts.

In figures: 1. seed layer; 2. titanium electrode layer; 3. gold electrode layer; 4. saw-toothed electrode; 5. nanowire; 6. dark current; 7. photocurrent; and 8. current.

DETAILED DESCRIPTION

The following clearly and completely describes the technical solutions in the embodiments of the present invention with reference to the accompanying drawings in the embodiments of the present invention. Apparently, the described embodiments are some rather than all of the embodiments of the present invention. All other embodiments obtained by a person of ordinary skill in the art based on the embodiments of the present invention without creative efforts shall fall within the protection scope of the present invention.

To make the objectives, features, and advantages of the present invention more obvious and easy to understand, the following further describes the present invention in detail with reference to the accompanying drawings and specific implementations.

Figure 1:
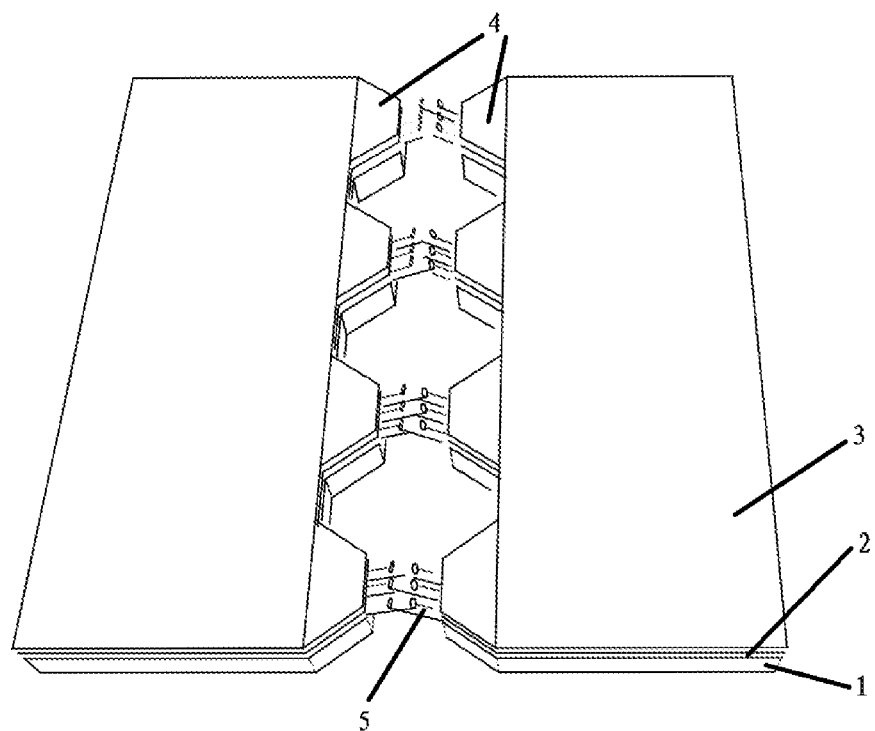
FIG. 1 is a structural diagram of a saw-toothed electrode according to an embodiment of the present invention.
Figure 2:
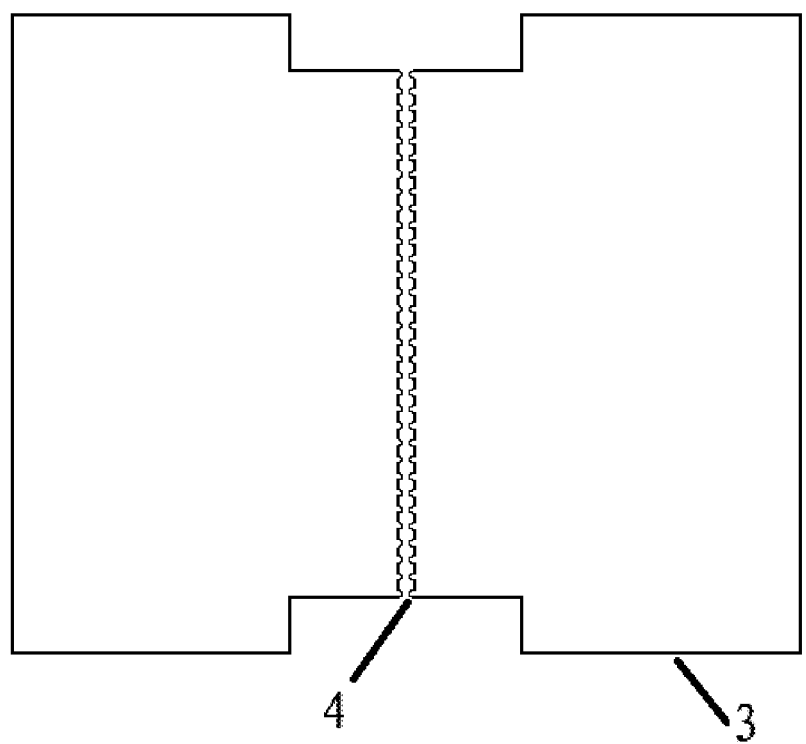
FIG. 2 is a layout of a saw-toothed electrode according to an embodiment of the present invention.
Figure 3:
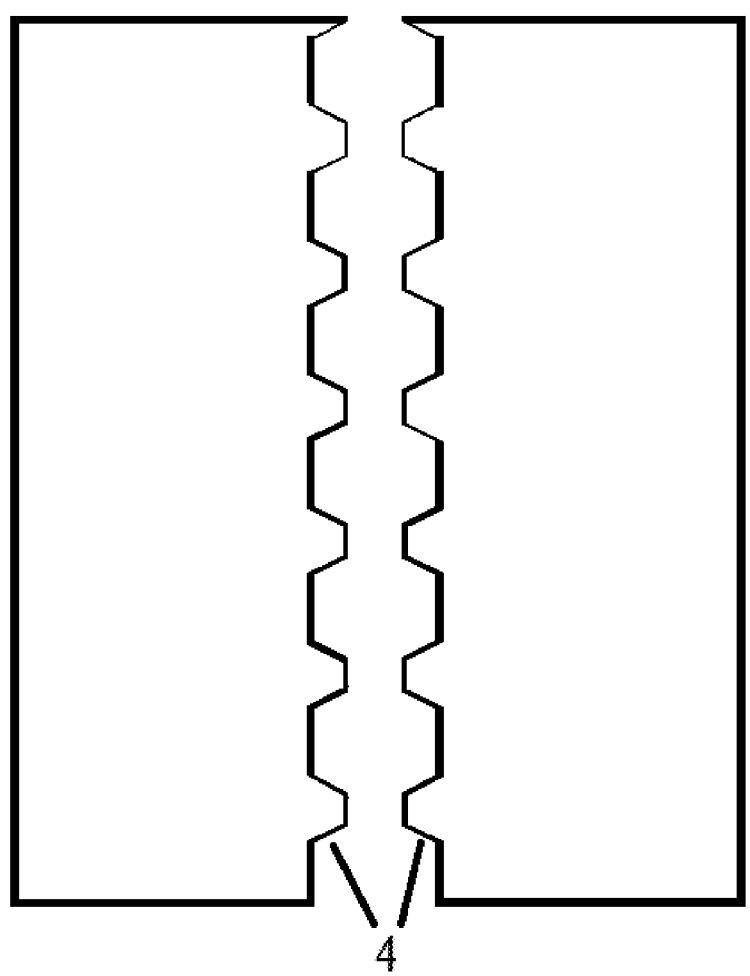
FIG. 3 is a detailed layout of a saw-toothed electrode according to an embodiment of the present invention.

An embodiment provides a saw-toothed electrode. FIG. 1 is a structural diagram of a saw-toothed electrode according to an embodiment of the present invention. FIG. 2 shows a layout of a saw-toothed electrode according to an embodiment of the present invention. FIG. 3 shows a detailed layout of a saw-toothed electrode according to an embodiment of the present invention. Referring to FIG. 1, FIG. 2, and FIG. 3, a shape of a saw-toothed electrode 4 includes two symmetrically arranged patterns.

The pattern includes a rectangle and multiple isosceles trapeziums; a length of an upper base of each isosceles trapezium is less than that of a lower base thereof; and the lower bases of all the isosceles trapeziums are connected to a same long side of the rectangle.

Opposite sides of the two symmetrically arranged patterns are sides on which multiple isosceles trapeziums are located; equal-length legs and the upper base of the isosceles trapezium are used to grow nanowires 5; and nanowires grown on upper bases of two isosceles trapeziums, symmetric to each other, on the opposite sides of the two patterns to form bridges, and a distance between the upper bases of the two isosceles trapeziums symmetric to each other is 5-10 μm. Compared with an ordinary electrode on which nanowires are horizontally grown, the saw-toothed electrode in this embodiment can reduce the number of nanowire bridges, avoid shielding of an effective photosensitive area of a detector, and increase a response speed and an optical gain of a nanowire UV detector. In addition, after the nanowires are grown, there is no need to remove excessive nanowires through ultrasonic treatment, reducing processing steps.

The length of the upper base of the isosceles trapezium is 2-10 μm, the length of the lower base of the isosceles trapezium is 5-25 μm, and the height of the isosceles trapezium is 5-25 μm. The size of the isosceles trapezium can be adjusted according to the ratio: the length of the upper base of the isosceles trapezium:the length of the lower base of the isosceles trapezium:the height of the isosceles trapezium=1:2.5:2.5.

A distance between center lines of two adjacent isosceles trapeziums is equal to a height of the isosceles trapezium, and is 5-25 μm. The distance between center lines of two adjacent isosceles trapeziums can be adjusted according to the ratio: the distance between center lines of two adjacent isosceles trapeziums:the height of the isosceles trapezium=1:1.

The saw-toothed electrode 4 includes an electrode substrate (not shown in all of FIG. 1 to FIG. 3), a seed layer 1, and a combination electrode layer.

The seed layer 1 is arranged on the electrode substrate, and a thickness of the seed layer 1 is 50-400 nm.

The combination electrode layer includes a titanium electrode layer 2 and a gold electrode layer 3. The titanium electrode layer 2 is arranged on the seed layer 1, and the gold electrode layer 3 is arranged on the titanium electrode layer 2.

A thickness of the titanium electrode layer 2 is 15-40 nm; and a thickness of the gold electrode layer 3 is 50-400 nm.

This embodiment provides a nanowire UV detector, including an electrode substrate, a seed layer, and a combination electrode layer.

The seed layer is deposited on the electrode substrate. The seed layer may be a zinc oxide (ZnO) thin film layer, and a thickness of the seed layer is 50-400 nm.

A shape of the seed layer includes two symmetrically arranged patterns, which includes a rectangle and multiple isosceles trapeziums. A length of an upper base of each isosceles trapezium is less than that of a lower base thereof. The lower bases of all the isosceles trapeziums are connected to the same long side of the rectangle. A distance between center lines of two adjacent isosceles trapeziums is equal to a height of the isosceles trapezium, and is 5-25 μm. The length of the upper base of the isosceles trapezium is 2-10 μm, the length of the lower base of the isosceles trapezium is 5-25 μm, and the height of the isosceles trapezium is 5-25 μm. The size of the isosceles trapezium can be adjusted according to the ratio: the length of the upper base of the isosceles trapezium:the length of the lower base of the isosceles trapezium:the height of the isosceles trapezium=1:2.5:2.5.

Opposite sides of the two symmetrically arranged patterns are sides on which multiple isosceles trapeziums are located; the distance between center lines of two adjacent isosceles trapeziums can be adjusted according to the ratio: the distance between center lines of two adjacent isosceles trapeziums:the height of the isosceles trapezium=1:1. Equal-length legs and the upper base of the isosceles trapezium are used to grow nanowires. Because an upper base of an isosceles trapezium of the ZnO thin film layer is straight, ZnO nanowires in an effective photosensitive area can be are horizontally grown, and form horizontal bridges with ZnO nanowires grown on an upper base of another isosceles trapeziums symmetric to the isosceles trapezium; while equal-length legs of the isosceles trapezium are oblique relative to the upper base thereof, and ZnO nanowires are obliquely grown at the equal-length legs, which cannot form effective bridges with ZnO nanowires grown on equal-length legs of another isosceles trapeziums symmetric to the isosceles trapezium. Compared with an existing electrode on which ordinary nanowires are horizontally grown, the nanowire UV detector in this embodiment reduces the number of nanowire bridges, and avoids shielding of an effective photosensitive area of the nanowire UV detector. A distance between upper bases of two isosceles trapeziums symmetric to each other is 5-10 μm.

The combination electrode layer includes a titanium electrode layer and a gold electrode layer.

The titanium electrode layer is deposited on the seed layer, and a thickness of the titanium (Ti) electrode layer is 15-40 nm. The gold electrode layer is deposited on the titanium electrode layer, and a thickness of the gold (Au) electrode layer is 50-400 nm. The titanium electrode layer is located between the ZnO thin film layer and the Au electrode layer, and this can increase adhesion of the ZnO thin film layer and the Au electrode layer. Both shapes of the titanium electrode layer and the gold electrode layer are the same as that of the seed layer.

A structure of the nanowire UV detector successively includes the electrode substrate, the ZnO thin film layer, the Ti electrode layer, and the Au electrode layer from the bottom up. A length of ZnO nanowires growing in the ZnO thin film layer is 3-5 μm, and a diameter of ZnO nanowires is 50-300 nm.

In this embodiment, there are multiple same isosceles trapezoids on the opposite sides of the two patterns of the seed layer of the nanowire UV detector. Nanowires are directly grown on the side wall of the seed layer and only nanowires grown on the upper bases of the isosceles trapeziums form effective bridges. Compared with an electrode on which nanowires are vertically grown, the saw-toothed electrode can obtain a larger illumination area, improve optical efficiency, and increase a response speed and an optical gain. Compared with an ordinary electrode on which nanowires are horizontally grown, the saw-toothed electrode can reduce the number of nanowire bridges and increase a response speed and an optical gain of a nanowire UV detector. In addition, after the nanowires are grown, there is no need to remove excessive nanowires through ultrasonic treatment, which reduces the process and costs and is easy to implement mass production.

Figure 4:
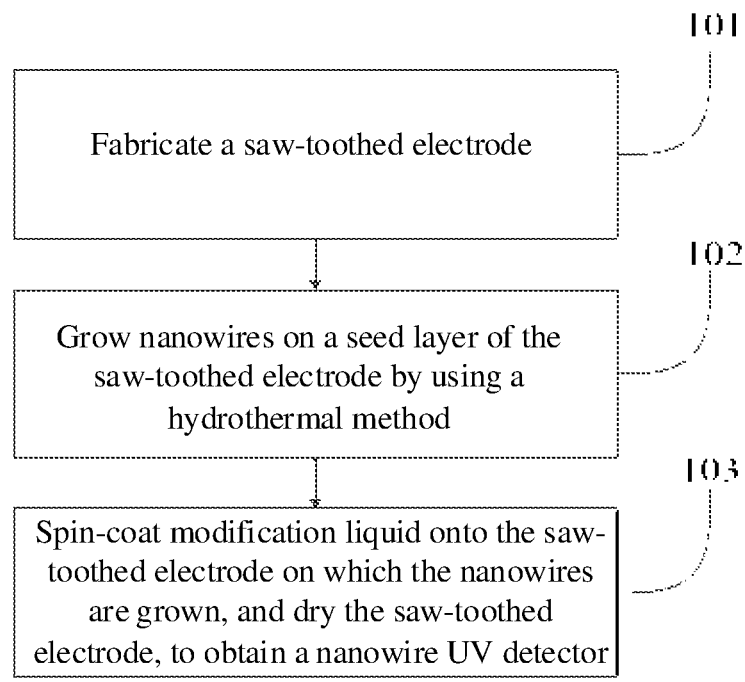
FIG. 4 is a flowchart of a method for enhancing the performance of a nanowire UV detector according to an embodiment of the present invention.

This embodiment provides a method for enhancing the performance of a nanowire UV detector. FIG. 4 is a flowchart of the method for enhancing the performance of a nanowire UV detector according to this embodiment of the present invention. Referring to FIG. 4, the method for enhancing the performance of a nanowire UV detector includes the following steps:

Step 101. Fabricate a saw-toothed electrode, where the saw-toothed electrode includes two symmetrically arranged patterns, which includes a rectangle and multiple isosceles trapeziums; a length of an upper base of each isosceles trapezium is less than that of a lower base thereof; and the lower bases of all the isosceles trapeziums are connected to the same long side of the rectangle. Opposite sides of the two symmetrically arranged patterns are sides on which multiple isosceles trapeziums are located; and equal-length legs and the upper base of the isosceles trapezium are used to grow nanowires. Because the upper base of the isosceles trapezium of the seed layer is straight, nanowires in an effective photosensitive area can be horizontally grown, and nanowires grown on upper bases of two isosceles trapeziums, symmetric to each other, on the opposite sides of the two patterns form horizontal bridges; while the equal-length legs of the isosceles trapezium are oblique relative to the upper base thereof, and nanowires are obliquely grown at the equal-length legs, which cannot form effective bridges with nanowires grown on equal-length legs of another isosceles trapeziums symmetric to the isosceles trapezium. This reduces the number of nanowires forming bridges, and avoids shielding of an effective photosensitive area of a nanowire UV detector. A distance between upper bases of two isosceles trapeziums symmetric to each other is 5-10 μm. The length of the upper base of the isosceles trapezium is 2-10 μm, the length of the lower base of the isosceles trapezium is 5-25 μm, and the height of the isosceles trapezium is 5-25 μm. The size of the isosceles trapezium can be adjusted according to the ratio: the length of the upper base of the isosceles trapezium:the length of the lower base of the isosceles trapezium:the height of the isosceles trapezium=1:2.5:2.5. A distance between center lines of two adjacent isosceles trapeziums is equal to a height of the isosceles trapezium, and is 5-25 μm. The distance between center lines of two adjacent isosceles trapeziums can be adjusted according to the ratio: the distance between center lines of two adjacent isosceles trapeziums:the height of the isosceles trapezium=1:1. The saw-toothed electrode includes an electrode substrate, a seed layer, and a combination electrode layer. The seed layer is arranged on the electrode substrate, and a thickness of the seed layer is 50-400 nm. The combination electrode layer includes a titanium electrode layer and a gold electrode layer. The titanium electrode layer is arranged on the seed layer, and the gold electrode layer is arranged on the titanium electrode layer. A thickness of the titanium electrode layer is 15-40 nm, and a thickness of the gold electrode layer is 50-400 nm.

Step 101 specifically includes:

Fabricate a photomask according to a layout, where a shape of the layout is the shape of the saw-toothed electrode. Specifically the photomask is fabricated according to the layout by direct electron-beam writing or direct laser writing.

Clean the electrode substrate, where a material of the electrode substrate is silicon dioxide ($SiO_2$). The step specifically includes first cleaning the electrode substrate twice with acetone, then cleaning the electrode substrate twice with ethanol, and finally cleaning the electrode substrate twice with deionized water.

Cover the photomask on the cleaned electrode substrate, and conduct photoetching on the electrode substrate to obtain the layout, where the developing time of photoresist during photoetching is 3-5 s longer than the normal development time of the photoresist. In this embodiment, AZ5214E photoresist is used. The developing time of the photoresist is 24-28 s and is 3-5 s longer than the normal developing time of the AZ5214E photoresist. In this way, the photoresist is more sufficiently developed, and the shape of the saw-toothed electrode is clearer. In actual application, after the photoresist is developed according to the normal developing time, a developing status can be observed by a microscope, and the photoresist is further developed for 3-5 s according to the developing status.

Sputter the seed layer on the layout. Specifically, the seed layer is sputtered on the layout by using a magnetron sputtering method. The power used in the magnetron sputtering method is preferably 150-250 W.

Sputter the titanium electrode layer on the seed layer. Specifically, the titanium electrode layer is sputtered on the layout by using the magnetron sputtering method. The power used in the magnetron sputtering method is preferably 150-250 W.

Sputter the gold electrode layer on the titanium electrode layer to obtain an initial device. The sputtering the gold electrode layer on the titanium electrode layer is specifically sputtering the gold electrode layer on the layout by using the magnetron sputtering method. The power used in the magnetron sputtering method is preferably 150-250 W.

Remove photoresist on the initial device by using a stripping technology to obtain the saw-toothed electrode. Shapes of the seed layer, the titanium electrode layer, and the gold electrode layer of the saw-toothed electrode are all the shape of the layout. The photoresist is negative photoresist, and a coating thickness of the negative photoresist is greater than 1 µm, which facilitates stripping of the photoresist.

The removing photoresist on the initial device by using a stripping technology to obtain the saw-toothed electrode specifically includes:

soaking the initial device in acetone; and stripping the photoresist on the soaked initial device by ultrasonic treatment.

Step 102. Grow nanowires on the seed layer of the saw-toothed electrode by using a hydrothermal method, where nanowires are grown on equal-length legs and an upper base of an isosceles trapezium of the seed layer; and nanowires grown on upper bases of two isosceles trapeziums, symmetric to each other, on the opposite sides of the two patterns form bridges.

Step 102 specifically includes:

dissolving zinc nitrate hexahydrate and hexamethylenetetramine in deionized water according to 1:1-1:2, stirring an obtained solution for a preset time by using a magnetic stirring bar to obtain a nanowire culture solution, and pouring the nanowire culture solution into a container, where the concentration of the zinc nitrate hexahydrate is preferably 0.5-1 mmol, and the concentration of the hexamethylenetetramine is preferably 0.5-2 mmol; and placing the surface of the saw-toothed electrode with the seed layer, the titanium electrode layer, and the gold electrode layer in the nanowire culture solution, and placing the container containing the saw-toothed electrode and the nanowire culture solution in an incubator for growing nanowires. The temperature used in the hydrothermal method is preferably 70-90° C., and the time for hydrothermal treatment is preferably 7-15 h. In other words, the temperature of the incubator is preferably 70-90° C., and the time for holding the container containing the saw-toothed electrode and the nanowire culture solution in the incubator for growing nanowires is preferably 7-15 h. A length of the grown nanowires is 3-5 µm, and a diameter of the grown nanowires is 50-300 µm.

Step 103. Pin-coat the surface modification solution onto the saw-toothed electrode on which the nanowires are grown, and dry the saw-toothed electrode, to obtain the nanowire UV detector.

Step 103 specifically includes:

taking out the saw-toothed electrode on which the nanowires are grown from the nanowire culture solution, and drying the saw-toothed electrode;

spin-coating the modification solution onto the surface of the dried saw-toothed electrode at a preset speed; and placing the spin-coated saw-toothed electrode in an incubator for baking, to obtain the nanowire UV detector.

After the nanowire UV detector is fabricated, the performance of the nanowire UV detector can be tested by test equipment. The tested performance includes a dark current of the nanowire UV detector, a photocurrent in response to UV light irradiation, and a speed of response to UV light irradiation.

This embodiment provides two specific implementations of the method for enhancing the performance of a nanowire UV detector.

Implementation 1:

A photomask is fabricated according to a layout by direct electron-beam writing or direct laser writing, where a shape of the layout is a shape of a saw-toothed electrode.

A $SiO_2$ layer with a thickness of 300 nm is formed on the surface of a silicon (Si) wafer by high-temperature oxidation. The Si wafer containing the silicon dioxide ($SiO_2$) layer is used as an electrode substrate, and the $SiO_2$ layer is an insulating layer.

The electrode substrate is first cleaned twice with acetone, then cleaned twice with ethanol, and finally cleaned twice with deionized water. The photomask is covered on the cleaned electrode substrate, and the layout is formed on the electrode substrate by UV lithography.

On the layout formed by photoetching, a zinc oxide seed layer with a thickness of 95 nm is sputtered by using a radio frequency magnetron sputtering method. A titanium electrode layer with a thickness of 15 nm is sputtered on the zinc oxide seed layer by using the radio frequency magnetron sputtering method. An Au electrode layer with a thickness of 150 nm is sputtered on the titanium electrode layer by using the radio frequency magnetron sputtering method, to obtain an initial device. A sputtering target needs to be rotated and tilted by 60° during sputtering.

The initial device is soaked in acetone, and then photoresist on the electrode substrate of the initial device is stripped by ultrasonic treatment, leaving only the shape of the layout to obtain a saw-toothed electrode.

A nanowire culture solution is prepared by using zinc nitrate hexahydrate and hexamethylenetetramine according to a proportion of 1:1. Specifically, 1 mmol zinc nitrate hexahydrate and 1 mmol hexamethylenetetramine are dissolved in 1 L of deionized water, and an obtained solution is stirred for 2 h by using a magnetic stirring bar to obtain a nanowire culture solution.

The nanowire culture solution is poured into a container. The surface of the saw-toothed electrode with the seed layer, the titanium electrode layer, and the gold electrode layer is gently placed in the nanowire culture solution. Then, the container containing the saw-toothed electrode and the nanowire culture solution is placed in an incubator for growing nanowires. The growth temperature in the incubator is 80° C., and the growth time is 8 h.

After the growth of the nanowires, the saw-toothed electrode on which the nanowires are grown is taken out, and stranded and dried in air.

Next, the surface modification solution is prepared by dissolving 1 mmol silver nitrate and 0.01 mmol polyvinyl pyrrolidone (PVP) in 50 mL of anhydrous ethanol; and the modification solution is spin-coated onto the surface of the dried saw-toothed electrode at 2000 r/min. The spin-coated saw-toothed electrode is placed in an incubator at 100° C. for baking for 3 min, and the nanowires on the spin-coated saw-toothed electrode are modified. In this way, the modified saw-toothed electrode is a nanowire UV detector.

Figure 5:
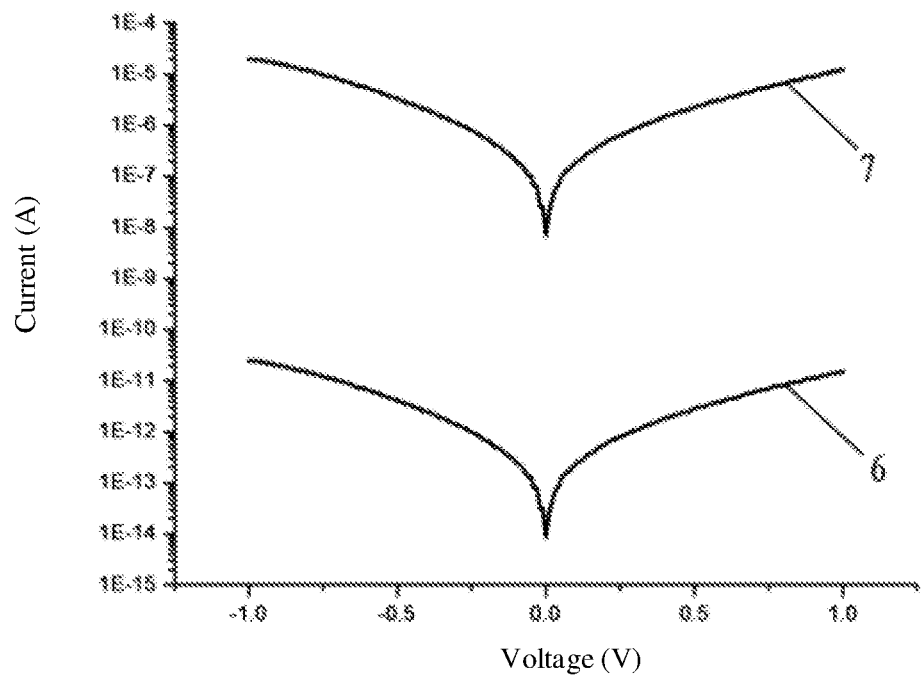
FIG. 5 is a comparison diagram of a photocurrent and a dark current of a nanowire UV detector according to Implementation 1 of the present invention.
Figure 6:
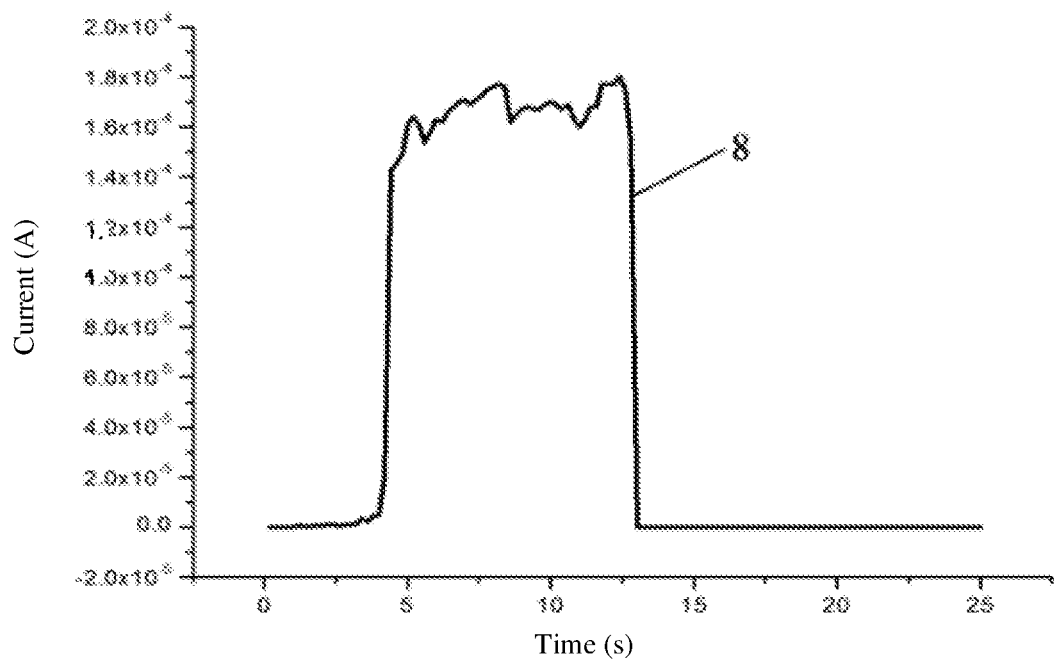
FIG. 6 is a current-time chart of a nanowire UV detector according to Implementation 1 of the present invention.

The photoelectric response test is conducted on the nanowire UV detector by using a Keysight B1500A semiconductor parameter analyzer. The semiconductor parameter analyzer is connected to a probe station in a Faraday cage through a wire. During test, a UV lamp with a wavelength of 365 nm and light intensity of 10 mw/cm$^2$ is used; probes at the probe station are respectively stuck at Au electrode layers, symmetric to each other, of the nanowire UV detector to respectively test a dark current, a photocurrent, and a current (I)-time (T) response of the nanowire UV detector. FIG. 5 is a comparison diagram of a photocurrent and a dark current of the nanowire UV detector according to Implementation 1 of the present invention. In FIG. 5, the horizontal ordinate represents a voltage in a unit of volt (V); the vertical coordinate represents a current in a unit of ampere (A); 6 represents a dark current; and 7 represents a photocurrent. FIG. 6 is a current-time chart of the nanowire UV detector according to Implementation 1 of the present invention. In FIG. 6, the horizontal ordinate represents time in a unit of second (s); the vertical coordinate represents a current in a unit of ampere (A); and 8 represents a current. Referring to FIG. 5 and FIG. 6, when a voltage is 1 V, a dark current of the nanowire UV detector is $2.47E^{-11}$ A, a photocurrent is $2.00E^{-0.5}$ A, an optical gain is $8.08E^5$, a rise time is 0.4 s, and a fall time is 0.2 s. A rise time of an ordinary thin film nanowire UV detector is 20 s, a fall time is 80 s, an optical gain or a photo-to-dark current ratio is $10E^3$; while a rise time of a response speed of the nanowire UV detector prepared in Implementation 1 is 0.4 s, a fall time is 0.2 s, and an optical gain is $10E^5$. Therefore, the response speed of the nanowire UV detector is higher and is 100 times higher than that of the ordinary thin film nanowire UV detector. In addition, a UV light gain and a photoresponse speed can be increased.

Implementation 2

A photomask is fabricated according to a layout by direct electron-beam writing or direct laser writing, where a shape of the layout is a shape of a saw-toothed electrode.

A $SiO_2$ layer with a thickness of 300 nm is formed on the surface of a silicon (Si) wafer by high-temperature oxidation. The Si wafer containing the silicon dioxide ($SiO_2$) layer is used as an electrode substrate, and the $SiO_2$ layer is an insulating layer.

The electrode substrate is first cleaned twice with acetone, then cleaned twice with ethanol, and finally cleaned twice with deionized water. The photomask is covered on the cleaned electrode substrate, and the layout is formed on the electrode substrate by UV lithography.

On the layout formed by photoetching, a zinc oxide seed layer with a thickness of 115 nm is sputtered by using a radio frequency magnetron sputtering method. A titanium electrode layer with a thickness of 15 nm is sputtered on the zinc oxide seed layer by using the radio frequency magnetron sputtering method. An Au electrode layer with a thickness of 150 nm is sputtered on the titanium electrode layer by using the radio frequency magnetron sputtering method, to obtain an initial device. A sputtering target needs to be rotated and tilted by 60° during sputtering.

The initial device is soaked in acetone, and then photoresist on the electrode substrate of the initial device is stripped by ultrasonic treatment, leaving only the shape of the layout and obtain a saw-toothed electrode.

A nanowire culture solution is prepared by using zinc nitrate hexahydrate and hexamethylenetetramine according to a proportion of 1:1. Specifically, 1 mmol zinc nitrate hexahydrate and 1 mmol hexamethylenetetramine are dissolved in 1 L of deionized water, and an obtained solution is stirred for 2 h by using a magnetic stirring bar to obtain a nanowire culture solution.

The nanowire culture solution is poured into a container. The surface of the saw-toothed electrode with the seed layer, the titanium electrode layer, and the gold electrode layer is gently placed in the nanowire culture solution. Then, the container containing the saw-toothed electrode and the nanowire culture solution is placed in an incubator for growing nanowires. The growth temperature in the incubator is 80° C., and the growth time is 10 h.

After the growth of the nanowires, the saw-toothed electrode on which the nanowires are grown is taken out, and stranded and dried in air.

Next, the surface modification solution is prepared by dissolving 1 mmol silver nitrate and 0.01 mmol PVP in 50 mL of anhydrous ethanol; and the modification solution is spin-coated onto the surface of the dried saw-toothed electrode at 2000 r/min. The spin-coated saw-toothed electrode is placed in an incubator at 100° C. for baking for 3 min, and the nanowires on the spin-coated saw-toothed electrode are modified. In this way, the modified saw-toothed electrode is a nanowire UV detector.

Figure 7:
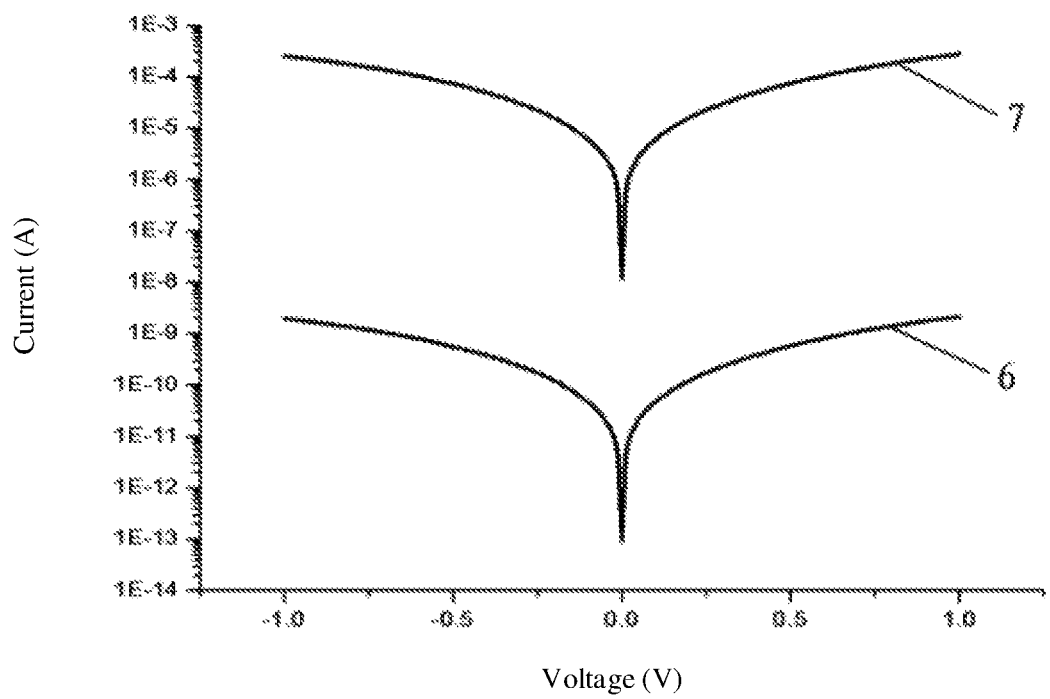
FIG. 7 is a comparison diagram of a photocurrent and a dark current of a nanowire UV detector according to Implementation 2 of the present invention.
Figure 8:
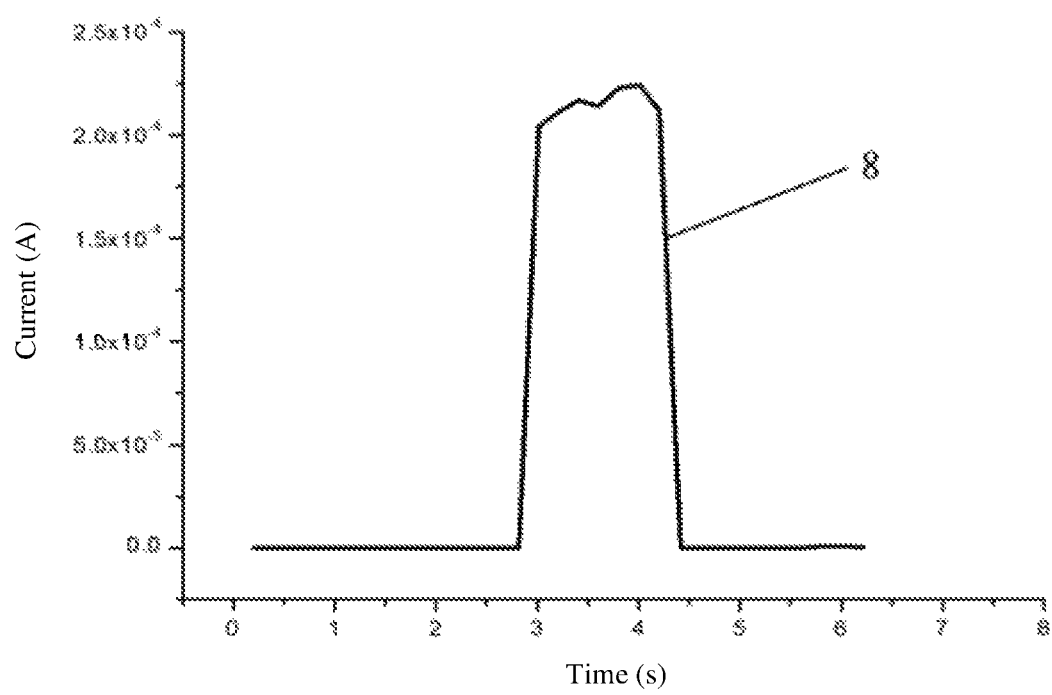
FIG. 8 is a current-time chart of a nanowire UV detector according to Implementation 2 of the present invention.

The photoelectric response test is conducted on the nanowire UV detector by using a Keysight B1500A semiconductor parameter analyzer. The semiconductor parameter analyzer is connected to a probe station in a Faraday cage through a wire. During test, a UV lamp with a wavelength of 365 nm and light intensity of 10 mw/cm$^2$ is used; probes at the probe station are respectively stuck at Au electrode layers, symmetric to each other, of the nanowire UV detector to respectively test a dark current, a photocurrent, and an I-T response. The I-T response refers to a current-time response. FIG. 7 is a comparison diagram of a photocurrent and a dark current of the nanowire UV detector according to Implementation 2 of the present invention. In FIG. 7, the horizontal ordinate represents a voltage in a unit of volt (V); the vertical coordinate represents a current in a unit of ampere (A); 6 represents a dark current; and 7 represents a photocurrent. FIG. 8 is a current-time chart of the nanowire UV detector according to Implementation 2 of the present invention. In FIG. 8, the horizontal ordinate represents time in a unit of second (s); the vertical coordinate represents a current in a unit of ampere (A); and 8 represents a current. Referring to FIG. 7 and FIG. 8, when a voltage is 1 V, a dark current of the nanowire UV detector is $1.96E^{-11}$ A, a photocurrent is $2.52 E^{-0.5}$ A, an optical gain is $1.29E^5$, a rise time is 0.2 s, and a fall time is 0.2 s. A rise time of an ordinary thin film nanowire UV detector is 20 s, a fall time is 80 s; while a rise time of a response speed of the nanowire UV detector prepared in Implementation 2 is 0.2 s, and a fall time is 0.2 s. Therefore, the nanowire UV detector has a higher response speed. Therefore, a UV light gain and a photoresponse speed of the nanowire UV detector can be increased.

Each embodiment of the present specification is described in a progressive manner, each embodiment focuses on the difference from other embodiments; and for the same and similar parts between the embodiments, cross reference may be made.

In this specification, specific examples are used for illustration of the principles and embodiments of the present invention. The description of the foregoing embodiments is used to help understand the method of the present invention and the core principles thereof. In addition, a person skilled in the art can make various modifications in terms of specific embodiments and scope of application in accordance with the teachings of the present invention. In conclusion, the content of this specification should not be construed as a limitation to the present invention.

What is claimed is:

1. A saw-toothed electrode, wherein the saw-toothed electrode comprises two symmetrically arranged patterns;
each of the two symmetrically arranged patterns comprise a rectangle and multiple isosceles trapeziums;
a length of an upper base of each isosceles trapezium is less than that of a lower base thereof;
the lower bases of all the isosceles trapeziums are connected to a same long side of the rectangle; and
a distance between center lines of two adjacent isosceles trapeziums is equal to a height of the isosceles trapezium; and
multiple isosceles trapeziums are symmetrically located on opposite long sides of the rectangles of the two patterns;
equal-length legs and the upper base of the isosceles trapezium are configured to grow nanowires; and
nanowires grown on upper bases of two isosceles trapeziums, symmetric to each other, on the opposite sides of the two patterns form bridges.

2. The saw-toothed electrode according to claim 1, wherein the saw-toothed electrode further comprises an electrode substrate, a seed layer, and a combination electrode layer;
the seed layer is arranged on the electrode substrate;
the combination electrode layer comprises a titanium electrode layer and a gold electrode layer; and
the titanium electrode layer is arranged on the seed layer, and the gold electrode layer is arranged on the titanium electrode layer.

3. The saw-toothed electrode according to claim 1, wherein the length of the upper base of the isosceles trapezium is 2-10 µm, the length of the lower base of the isosceles trapezium is 5-25 µm, and the height of the isosceles trapezium is 5-25 urn; and
the distance between center lines of two adjacent isosceles trapeziums is 5-25 µm.

4. The saw-toothed electrode according to claim 2, wherein a thickness of the seed layer is 50-400 nm, a thickness of the titanium electrode layer is 15-40 nm; and a thickness of the gold electrode layer is 50-400 nm.

* * * * *